(12) United States Patent
Wang et al.

(10) Patent No.: US 11,755,441 B2
(45) Date of Patent: Sep. 12, 2023

(54) DEBUGGING UNIT AND PROCESSOR

(71) Applicant: Alibaba Group Holding Limited, Grand Cafyman (KY)

(72) Inventors: Manzhou Wang, Hangzhou (CN); Ruqin Zhang, Hangzhou (CN)

(73) Assignee: Alibaba Group Holding Limited, Grand Cayman (KY)

( * ) Notice: Subject to any disclaimer, the term of this patent is extended or adjusted under 35 U.S.C. 154(b) by 379 days.

(21) Appl. No.: 17/013,221

(22) Filed: Sep. 4, 2020

(65) Prior Publication Data

US 2021/0089419 A1 Mar. 25, 2021

(30) Foreign Application Priority Data

Sep. 25, 2019 (CN) .......................... 201910913771.2

(51) Int. Cl.
*G06F 11/273* (2006.01)
*G06F 15/78* (2006.01)
*G06F 11/22* (2006.01)
*G06F 1/04* (2006.01)
*H03K 19/20* (2006.01)

(52) U.S. Cl.
CPC .............. *G06F 11/273* (2013.01); *G06F 1/04* (2013.01); *G06F 11/2236* (2013.01); *G06F 15/7807* (2013.01); *H03K 19/20* (2013.01)

(58) Field of Classification Search
CPC combination set(s) only.
See application file for complete search history.

(56) References Cited

U.S. PATENT DOCUMENTS

| 6,145,100 A * | 11/2000 | Madduri ............. G06F 11/3656 713/400 |
| 6,948,098 B2 * | 9/2005 | Pillay .................. G06F 11/2236 714/E11.166 |
| 7,047,443 B2 * | 5/2006 | Kudo .................... G06F 11/273 714/30 |
| 7,076,748 B2 * | 7/2006 | Kapoor ................. G06F 30/327 716/133 |
| 7,100,086 B1 * | 8/2006 | Kudo .................... G06F 11/273 714/E11.17 |

(Continued)

FOREIGN PATENT DOCUMENTS

| CN | 100388215 C | * | 5/2008 | ............ G06F 11/273 |
| CN | 102163182 A | * | 8/2011 | .......... G06F 11/2236 |

(Continued)

OTHER PUBLICATIONS

Optimization of Clock Gating Logic for Low Power LSI Design, by Xin Man, Sep. 2012 (Year: 2012).*

(Continued)

*Primary Examiner* — Berhanu Tadese

(57) ABSTRACT

The present invention discloses a debugging unit and a processor. The debugging unit includes; a register, adapted to sample input data under control of a clock signal; and a dock control unit, adapted to generate a control signal based on a clock enable signal to control the clock signal, so that the register is controlled to sample the input data in a validity period of the clock signal when the control signal is valid. The present invention also discloses a corresponding system-on-chip and an intelligent device including the system-on-chip.

22 Claims, 6 Drawing Sheets

(56) References Cited

U.S. PATENT DOCUMENTS

| | | | | |
|---|---|---|---|---|
| 7,114,101 | B2 * | 9/2006 | Kudo | G06F 11/273 |
| | | | | 714/30 |
| 8,996,918 | B2 * | 3/2015 | Matsukawa | G06F 11/28 |
| | | | | 714/30 |
| 9,213,615 | B2 * | 12/2015 | Matsukawa | G06F 11/3656 |
| 9,934,342 | B1 * | 4/2018 | Huang | G06F 30/3323 |
| 2021/0089419 | A1 * | 3/2021 | Wang | G06F 11/273 |

FOREIGN PATENT DOCUMENTS

| | | | | |
|---|---|---|---|---|
| CN | 102214132 A | * | 10/2011 | G06F 11/221 |
| CN | 103095783 A | * | 5/2013 | |
| CN | 103415777 A | * | 11/2013 | G01R 31/318508 |
| CN | 102214132 B | * | 7/2014 | G06F 11/221 |
| CN | 103415777 B | * | 9/2015 | G01R 31/318508 |
| CN | 102163182 B | * | 3/2016 | G06F 11/2236 |
| CN | 106960295 A | * | 7/2017 | G06Q 10/087 |
| CN | 106980572 A | * | 7/2017 | G06F 11/3644 |
| CN | 106990974 A | * | 7/2017 | G06F 8/65 |
| CN | 106997321 A | * | 8/2017 | |
| CN | 107038060 A | * | 8/2017 | G06F 16/957 |
| CN | 107179982 A | * | 9/2017 | G06F 11/3644 |
| CN | 107678938 A | * | 2/2018 | |
| CN | 107844410 A | * | 3/2018 | |
| CN | 108319548 A | * | 7/2018 | |
| CN | 108933713 A | * | 12/2018 | H04L 43/50 |
| CN | 109086193 A | * | 12/2018 | G06F 11/3466 |
| CN | 109101408 A | * | 12/2018 | G06F 11/327 |
| CN | 109542754 A | * | 3/2019 | G06F 11/3664 |
| CN | 109582561 A | * | 4/2019 | G06F 11/3624 |
| CN | 109861950 A | * | 6/2019 | |
| CN | 110347576 A | * | 10/2019 | |
| CN | 110704295 A | * | 1/2020 | |
| CN | 110750437 A | * | 2/2020 | G06F 11/362 |
| CN | 111124874 A | * | 5/2020 | |
| CN | 111125675 A | * | 5/2020 | G06F 21/44 |
| CN | 106980572 B | * | 3/2021 | G06F 11/3644 |
| CN | 110414248 B | * | 3/2021 | |
| CN | 112559437 A | * | 3/2021 | G06F 1/04 |
| CN | 109542754 B | * | 8/2021 | G06F 11/3664 |
| CN | 114666136 A | * | 6/2022 | |
| JP | 3684832 B2 * | | 8/2005 | G06F 11/273 |
| JP | 2011170654 A | * | 9/2011 | G06F 11/2236 |
| JP | 5467891 B2 * | | 4/2014 | G06F 11/2236 |
| WO | WO-2012155300 A1 | * | 11/2012 | G06F 11/221 |
| WO | WO-2016029792 A1 | * | 3/2016 | H04L 43/00 |
| WO | WO-2021061373 A1 | * | 4/2021 | G06F 1/04 |

OTHER PUBLICATIONS

Gated Clock Concersation in Vivado Synthesis. In forums. Xilinx. com, Jul. 24, 2019 (Year: 2019).*

Man, Xin "Optimization of Clock Gating Logic for Low Power LSI Design." In: Graduate School of Information, Production and Systems Waseda University (Shortened, pp. i-x and 1-20), Sep. 2012, (Online) [(Retrived on Nov. 4, 2020 (Nov. 4, 2020)] Retrived from the Internet <URL: http://groundsmart-mail.com/documents/o-p-t-i-m-i-z-a-t-i-o-n-o-f-c-l-o-c-k-g-a-t-i-n-g-l-o-g-i-clock-gating-is-to. html>, entire document.

"Gated Clock Concersation in Vivado Synthesis." In: forums. Xilinx.com, Jul. 24, 2019 (Online) [ Retrived on Nov. 4, 2020 (Nov. 4, 2020)] Retrived from the Internet <URL: https://forums.xilinx. com/t5/Design-and Debug-Techniques-Blog/Gated-Clock-Conversion-in-Vivado-Synthesis/ba-p/982650>, entire document.

* cited by examiner

DEBUGGING UNIT AND PROCESSOR

CROSS-REFERENCE TO RELATED APPLICATIONS

This application claims the benefit of Chinese Patent Application No. 201910913771.2 filed Sep. 25, 2019, is incorporated herein in its entirety.

TECHNICAL FIELD

The present invention relates to the processor field, and in particular, to a debugging unit and a processor

BACKGROUND OF THE INVENTION

In a chip design, generally, a clock gating function is used to disable a clock of a logic unit that is currently not in use, to reduce switching power consumption. However, the clock gating function can be used only in earlier function simulation. When the design is placed in an FPGA for a board-level test later, clock resources an the FPGA are limited, far from satisfying a clock gate quantity requirement in a chip design process. Therefore, in the FPGA test, accuracy of the clock gating function cannot be verified. In an Xilinx 7 series as an example, the FPGA can provide a maximum of 24 clock regions, and one clock is used in one clock region. Therefore, a maximum of 24 different clocks may exist. However, in the design process, a clock gate quantity is far greater than this quantity. It is to provide each clock gate with a clock that can be independently controlled. Therefore, a solution to checking a clock gating function of a chip circuit, which can adapt to an FPGA test, is urgently required.

SUMMARY OF THE INVENTION

Therefore, the present invention provides a debugging unit and a processor in an effort to solve or at least alleviate at least one existing problem above.

According to one aspect of the present invention, a debugging unit is provided and includes: a register, adapted to sample input data under control of a clock signal; and a clock control unit, adapted to generate a control signal based on a clock enable signal to control the clock signal, so that the register is controlled to sample the input data in a validity period of the clock signal when the control signal is valid.

Optionally, in the debugging unit according to the present invention, the clock control unit is coupled to an enable interface of the register, and further adapted to generate a control signal based on the clock enable signal and an enable signal of the register; and the register includes: an input interface, adapted to receive the input data; the enable interface, adapted to receive the control signal; a clock interface, adapted to receive the clock signal; and an output interface, adapted to output data.

Optionally, in the debugging unit according to the present invention, an output port of the clock control unit is coupled to an input interface of the register, and further adapted to generate a control signal based on the input data and the clock enable signal, where the control signal is used to control the input data of the register; and the register includes: the input interface, adapted to receive the control signal; an enable interface, adapted to receive an enable signal of the register; a clock interface, adapted to receive the clock signal; and an output interface, coupled to an input port of the clock control unit, and adapted to input output data to the clock control unit.

Optionally, in the debugging unit according to the present invention, the clock control unit includes; an AND gate, where a first input port of the AND gate is adapted to receive the clock enable signal, a second input port of the AND gate is adapted to receive the enable signal of the register, and an output port of the AND gate is coupled to the enable interface of the register.

Optionally, in the debugging unit according to the present invention, the clock control unit includes: a data selector, adapted to select, under control of the clock enable signal, whether to output the enable signal of the register to the enable interface of the register.

Optionally, in the debugging unit according to the present invention, the clock control unit includes: a data selector, adapted to select, under control of the enable signal of the register, whether to output the clock enable signal to the enable interface of the register.

Optionally, in the debugging unit according to the present invention, the register is adapted to: in the validity period of the clock signal, if the clock enable signal and the enable signal of the register are both on high levels, sample the input data; or in the validity period of the clock signal, if the clock enable signal and the enable signal of the register are not both on high levels, skip sampling the input data.

Optionally, in the debugging unit according to the present invention, the clock control unit includes: a data selector, where a first input port of the data selector receives the input data, a second input port of the data selector receives the output data of the register, and the data selector is adapted to select, under control of the clock enable signal, to output the input data or output data to the input interface of the register.

Optionally, in the debugging unit according to the present invention, the register is adapted to: in the validity period of the clock signal, if the clock enable signal and the enable signal of the register are both high, sample the input data of the register; or in the validity period of the clock signal, if the clock enable signal is low and the enable signal of the register is high, sample the output data of the register.

According to another aspect of the present invention, a processor is provided and includes: the foregoing debugging unit; and a signal generation unit, adapted to generate a debugging signal for the debugging unit.

Optionally, in the processor according to the present invention, the debugging signal includes one or more of the following signals: a clock signal, a clock enable signal, and an enable signal of a register.

According to another aspect of the present invention, a system-on-chip is provided and includes the foregoing processor.

According to another aspect of the present invention, an intelligent device is provided and includes the foregoing system-on-chip.

In the solution according to the present invention, the clock enable signal for clock control is used to generate the control signal, and then the control signal and the clock signal are input together to the register, so that the register is controlled to sample the input data. Specifically, in the validity period of the clock signal, when the control signal is valid, the register is controlled to sample the input data. The solution according to the present invention may be applied to an FPGA test. In a chip design, for each register under control of a gated clock signal, this clock control unit may be configured to test a clock gating function of the register.

BRIEF DESCRIPTION OF THE DRAWINGS

To achieve the foregoing and related objectives, some illustrative aspects are described in combination with the following descriptions and accompanying drawings in this specification. The aspects indicate various ways for practicing the principles disclosed in this specification, and all the aspects and their equivalent aspects are intended to fall within the scope of the claimed subject matter. The foregoing and other objectives, features, and advantages of the present disclosure will become more apparent by reading the following detailed descriptions with reference to the accompanying drawings. Throughout the present disclosure, the same reference numeral generally represents the same part or element.

DETAILED DESCRIPTION OF THE INVENTION

The following describes exemplary embodiments of the present disclosure in more detail with reference to the accompanying drawings. Although the exemplary embodiments of the present disclosure are displayed in the accompanying drawings, it should be understood that the present disclosure may be implemented in various forms and should not be limited by the embodiments described herein. On the contrary, the embodiments are provided for more thorough understanding of the present disclosure, and can completely convey the scope of the present disclosure to those skilled in the art.

Figure 1:
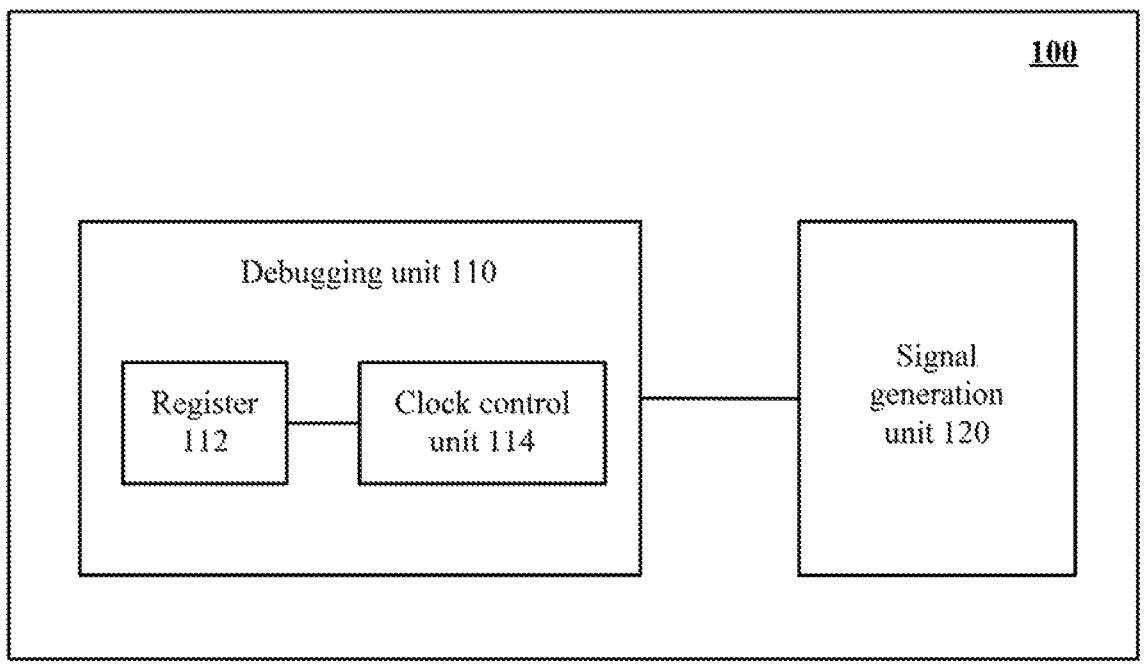
FIG. 1 illustrates a schematic diagram of a processor 100 according to an embodiment of the present invention.

FIG. 1 illustrates a schematic diagram of a processor 100 according to an embodiment of the present invention. In addition to an expected configuration, as shown in FIG. 1, the processor 100 further includes a debugging unit 110 and a signal generation unit 120. The debugging unit 110 further includes a register 112 and a clock control unit 114.

The signal generation unit 120 is coupled to the debugging unit 110, and generates a debugging signal for the debugging unit 110. According to an embodiment, the debugging signal includes one or more of the following signals: a clock signal (marked as clk), a clock enable signal (marked as clk_en), and an enable signal of the register (marked as en).

The debugging unit 110 may be configured to generate a control signal, where the control signal and the clock signal together implement a clock gating function. To be specific, the control signal and the clock signal are used together as a gated clock signal. In an embodiment, if the gated clock signal is enabled correctly, data may be accurately written to the register 112; otherwise, if the gated clock signal is disabled, new data is not written to the register 112.

In the debugging unit 110 designed according to this embodiment of the present invention, the register 112 receives the clock signal from the signal generation unit 120, and samples input data under control of the clock signal; in addition, the clock control unit 114 generates a control signal based on the clock enable signal from the signal generation unit 120, and uses the control signal to control the clock signal. In an embodiment, the register 112 samples the input data only in a validity period of the clock signal when the control signal is valid. On this basis, whether the clock gating function of the register is effective may be checked.

It should be noted that, based on an implementation of the present invention, the signal generation unit 120 may also be connected to the debugging unit 110 by using a network, and send the debugging signal to the debugging unit 110 by using the network, to control the debugging unit 110 to generate a gated clock signal. In this way, a remote cloud control test is implemented.

In addition, in this embodiment of the present invention, the register 112 is, for example, a 32-bit or 33-bit register, and may store data written by a processor core. This is not limited. In an FPGA test, any register controlled by a gated clock signal may use this solution for processing, to check whether the clock gating function in the design is effective.

Figure 2:
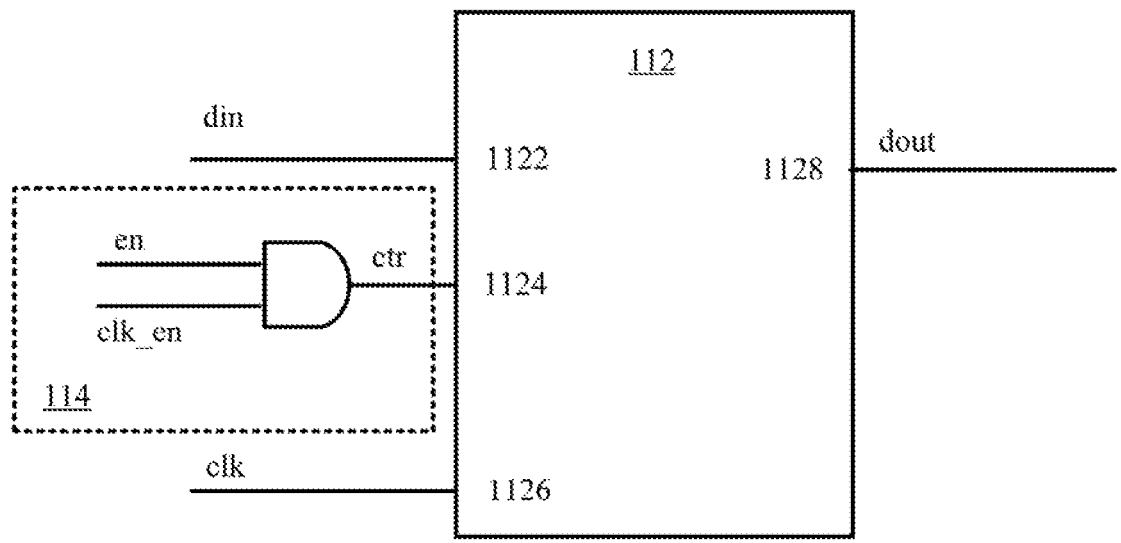
FIG. 2 illustrates a schematic diagram of a debugging unit 110 according to an embodiment of the present invention.
Figure 3:
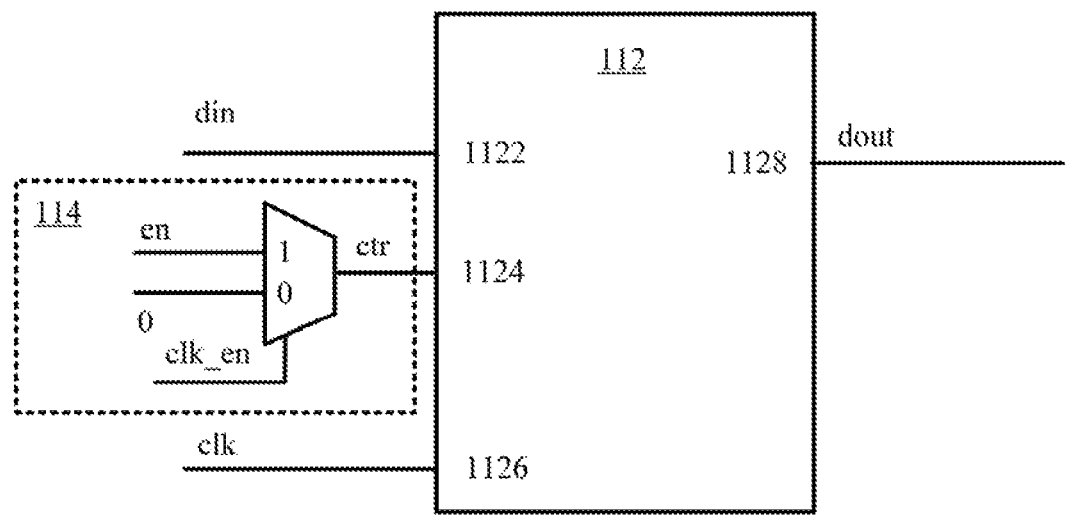
FIG. 3 illustrates a schematic diagram of a debugging unit 110 according to another embodiment of the present invention.
Figure 4:
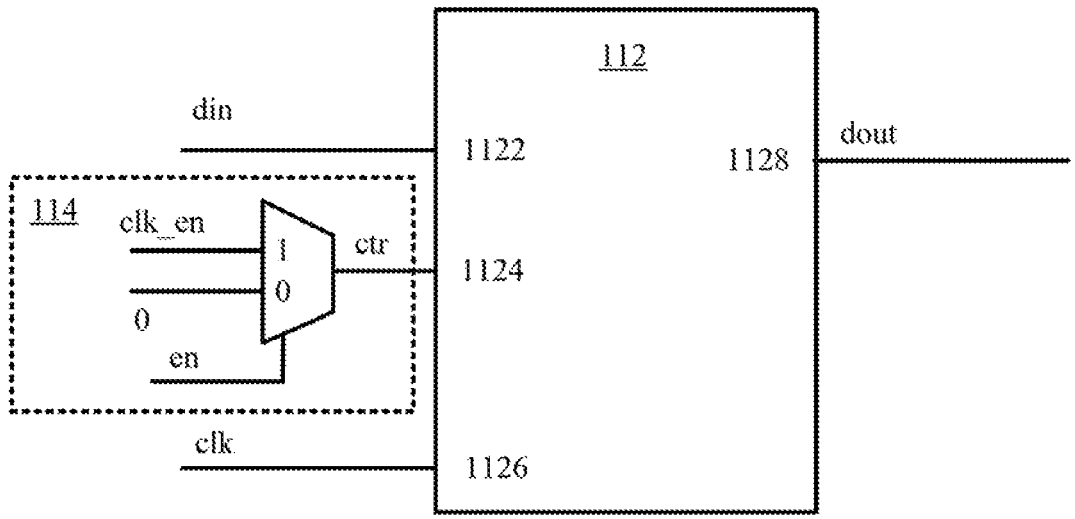
FIG. 4 illustrates a schematic diagram of a debugging unit 110 according to still another embodiment of the present invention.

With reference to FIG. 2 to FIG. 4, the following illustrates several schematic diagrams of the debugging unit 110 according to this embodiment of the present invention, to further describe a structure of the debugging unit 110.

As shown in FIG. 2, the register 112 includes an input interface 1122, an enable interface 1124, a clock interface 1126, and an output interface 1128.

In the implementation of the present invention, the input interface 1122 receives the input data (marked as din) input to the register 112. The clock interface 1126 receives the clock signal (marked as clk) from the signal generation unit 120. The enable interface 1124 is coupled to the clock control unit 114, to receive the control signal (marked as ctr). The control signal is generated by the clock control unit 114 based on the clock enable signal (marked as clk_en) and the enable signal (marked as en) of the register.

In an embodiment, the clock control unit 114 includes an AND gate. As shown in FIG. 2, a first input port of the AND gate receives the clock enable signal clk_en, and a second input port of the AND gate receives the enable signal en of the register 112. Therefore, the control signal ctr is generated by the AND gate by performing an AND operation on the clock enable signal clk_en and the enable signal en, and then the control signal ctr is output, through an output port of the AND gate, to the enable interface 1124 coupled to the AND gate.

Therefore, in the validity period of the clock signal clk, if the clock enable signal clk_en and the enable signal en are both on high levels, the control signal ctr is on a high level, and controls the register 112 to output data dout after sampling the input data din. Otherwise, in the validity period of the clock signal clk, if the clock enable signal clk_en and the enable signal en are not both on high levels, the control signal ctr is on a low level, and controls the register 112 to skip sampling the input data. To be specific, the register 112 updates the input data based on the control signal ctr.

It should be noted that, this embodiment of the present invention is not limited to the mode of performing the AND operation on the clock enable signal clk_en and the enable signal en to generate the control signal ctr. For example, based on Morgan's laws, the mode of the AND operation on the two signals may be converted into.

$$clk\_en \& en = !(!clk\_en + !en)$$

where & indicates an AND operation, ! indicates a negation operation, and + indicates an OR operation.

Based on the foregoing formula, the dock enable signal clk_en and the enable signal en are first input to a NOT gate respectively, to obtain negated signals thereof, and then the two negated signals are input to a NOR gate, to obtain the final control signal ctr. In this case, the clock control unit 114 includes two NOT gates and one NOR gate. Certainly, other methods may also be used to convert the mode of performing the AND operation on the two signals. The methods are not limited in this embodiment of the present invention, and are not exhaustively described herein for brevity.

In another embodiment, the clock control unit 114 includes a data selector. Further, the data selector is an either-or data selector. As shown in FIG. 3, the data selector has four ports in total, where two input ports are respectively connected to enable signals en and 0 of the register, one data selection port is connected to the clock enable signal clk_en, and one output port is coupled to the enable interface 1124. The data selector outputs the control signal ctr. In this embodiment of the present invention, the clock control unit 114 may select, under control of the clock enable signal clk_en, whether to output the enable signal en of the register to the enable interface 1124 of the register 112.

Therefore, in the validity period of the clock signal clk, if the clock enable signal clk_en is on the high level, an input port corresponding to "1", that is, the enable signal en of the register, is selected as an output; and when the enable signal en is on the high level, the control signal ctr is on the high level, and further controls the register 112 to sample the input data din and output the data dout. Otherwise, in the validity period of the clock signal clk, if the clock enable signal clk_en is on the high level but the enable signal en is on the low level, the control signal ctr is on the low level, and further controls the register 112 to skip sampling the input data. Furthermore, in the validity period of the clock signal clk, if the clock enable signal clk_en is on the low level, an input port corresponding to "0", that is, the low level, is selected as an output. In this case, the control signal ctr is on the low level, and controls the register 112 to skip sampling the input data.

In still another embodiment, the data selector included in the clock control unit 114 may further have another design. As shown in FIG. 4, the data selector has four ports in total, where two input ports are respectively connected to the clock enable signals clk_en and 0, one data selection port is connected to the enable signal en of the register, and one output port is coupled to the enable interface 1124. Therefore, the data selector outputs the control signal ctr. In this embodiment of the present invention, the clock control unit 114 may select, under control of the enable signal en of the register, whether to output the clock enable signal clk_en to the enable interface 1124 of the register 112.

In the clock control unit 114 shown in FIG. 4, in the validity period of the clock signal clk, if the enable signal en of the register is on the high level, an input port corresponding to "1", that is, the clock enable signal clk_en, is selected as an output; and when the clock enable signal clk_en is on the high level, the control signal ctr is on the high level, and further controls the register 112 to sample the input data din and output the data dout. Otherwise, in the validity period of the clock signal clk, if the enable signal en of the register is on the high level but the clock enable signal clk_en is on the low level, the control signal ctr is on the low level, and further controls the register 112 to skip sampling the input data. Furthermore, in the validity period of the clock signal clk, if the enable signal en is on the low level, an input port corresponding to "0", that is, the low level, is selected as an output. In this case, the control signal ctr is on the low level, and controls the register 112 to skip sampling the input data.

It should be noted that, the design of the data selector shown herein is used only as an example, and this embodiment of the present invention is not limited thereto. Based on the embodiment disclosed herein, those skilled in the art can think of another design, and use the clock enable signal clk_en and the enable signal of the register en to generate the control signal ctr, and replace an original enable signal of the register with the control signal to implement the clock gating function of the register.

Any operation of a data updating function implemented based on the clock enable signal clk_en by adding the clock enable signal clk_en to the enable interface 1124 of the register shall fall within the protection scope of the present invention.

In the implementation of the present invention, in an FPGA test, a corresponding clock control unit 114 is configured for each register under control of a gated clock signal in a chip design by using a software method, to implement the debugging unit 110 for testing the clock gating function of the register.

Figure 5:
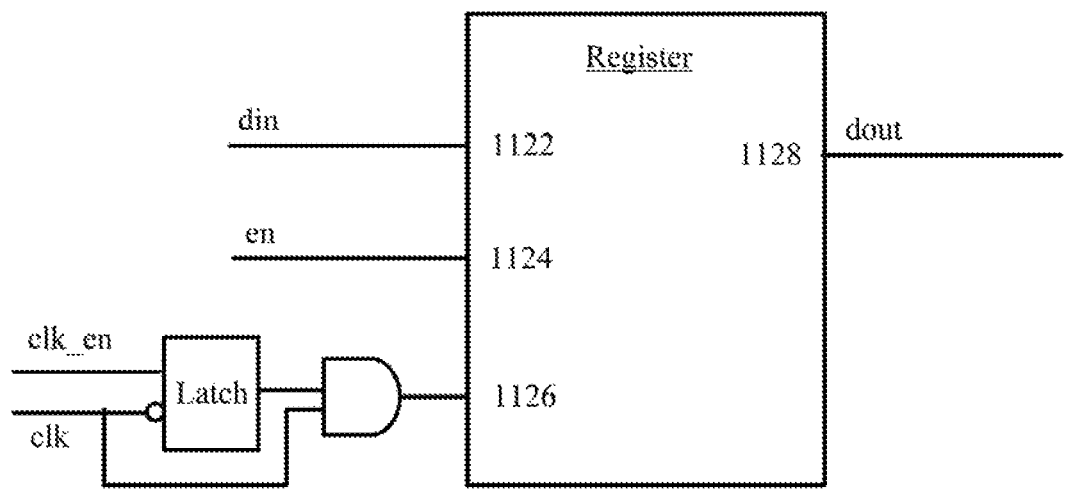
FIG. 5 illustrates a diagram of an existing clock gating circuit.

To further describe an advantage of the debugging unit 110 in Checking the clock gating function according to this embodiment of the present invention, FIG. 5 illustrates rates a diagram of an existing clock gating circuit for comparison.

As shown in FIG. 5, latches that are mutually coupled and an AND gate are coupled to a clock interface of a register. Input signals of the latches are a clock enable signal clk_en and a signal that is obtained after a clock signal clk is negated. Input signals of the AND gate are output signals of the latches and the clock signal clk. An output signal of the AND gate is input to the clock interface of the register, to control a clock gating function of the register.

Figure 6:
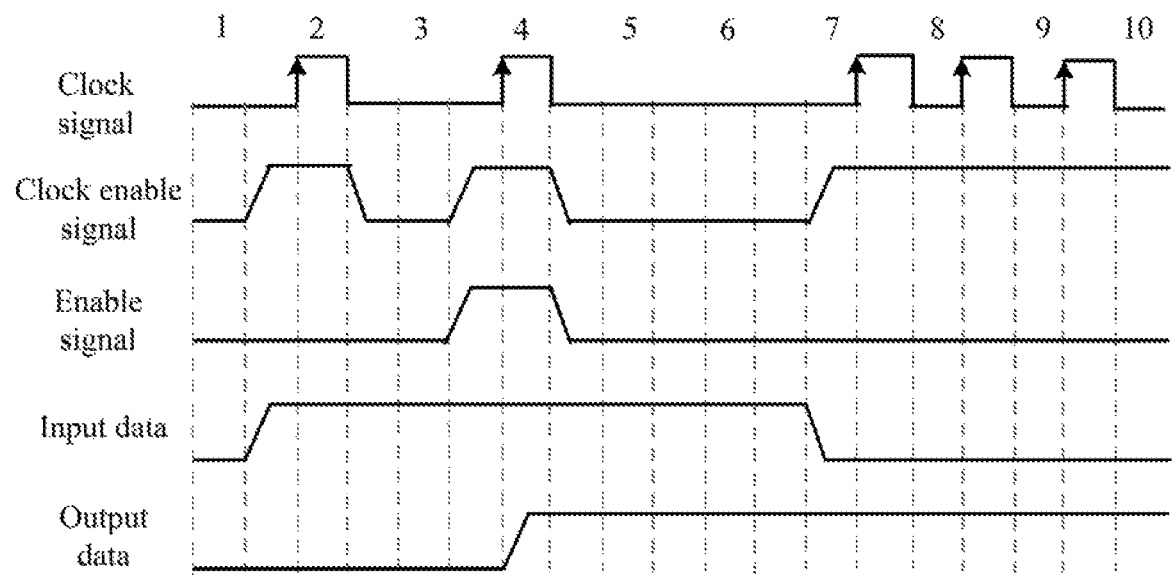
FIG. 6 illustrates a time sequence diagram of an existing clock gating circuit in an FPGA test.

FIG. 6 illustrates a time sequence diagram of an existing clock gating circuit in an FPGA test.

As shown in FIG. 6, a clock signal clk is valid only when a gated clock signal clk_en of the clock gating circuit is on a high level; otherwise, the clock signal clk is invalid. In addition, a register samples input data din only when the clock signal clk is valid and an enable signal en of the register is valid. In a second period shown in FIG. 6, a clock enable signal clk_en is already on a high level, but the enable signal en of the register is on a low level. In this case, a clock signal exists, but the register does not update the input data din to output data dout. Likewise, in a fourth period, the clock enable signal clk_en and the enable signal en of the register are both on high levels. In this case, the clock signal clk and the enable signal en of the register are both valid, and the register updates the input data din to output data dout.

It is assumed that the clock enable signal clk_en has a design defect, causing data updating not to be performed when required by the gated clock signal. This is not found in an earlier test, and then the design is placed in an FPGA for a test (such as a pressure test). Because there is no sufficient gated clock signal, the design is processed as a common FPGA circuit. To be specific, the clock enable signal clk_en does not function. In this case, a gated clock enabling function is not tested, and the register always updates data. Therefore, the design defect problem of the clock enable signal is ignored in FPGA test, and further cannot be resolved.

Figure 7:
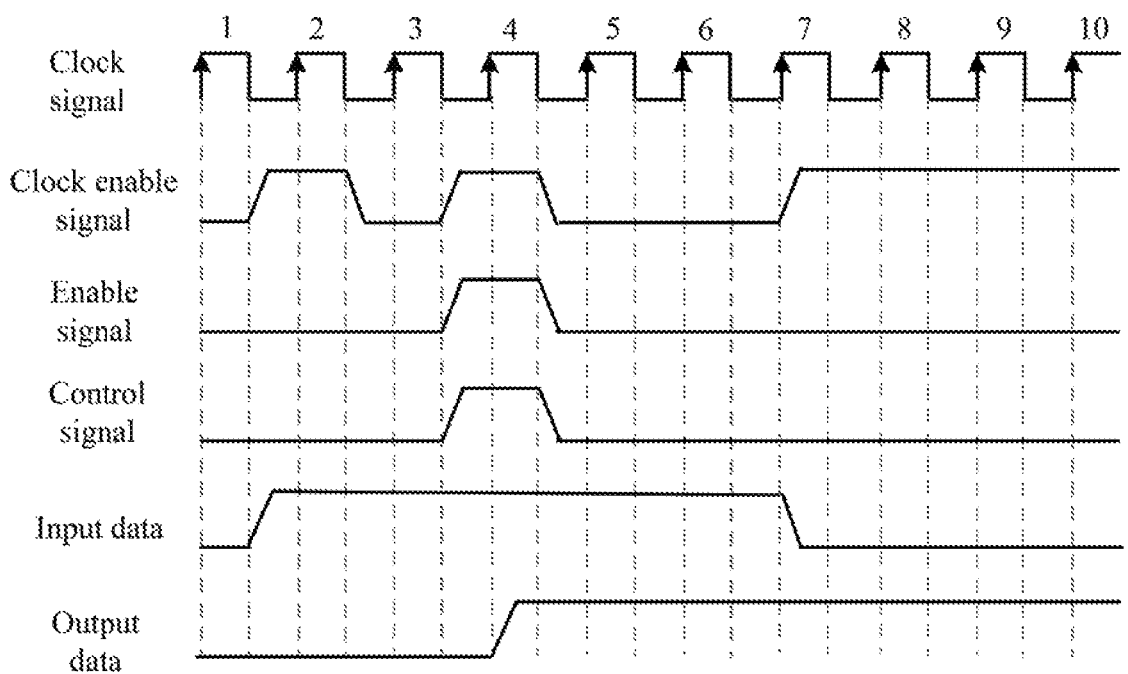
FIG. 7 illustrates a time sequence diagram of a debugging unit 110 in an FPGA test according to an embodiment of the present invention.

FIG. 7 illustrates a time sequence diagram of a clock gating circuit (that is, a debugging unit 110) in an FPGA test according to an embodiment of the present invention.

As shown in FIG. 7, when a clock signal clk is valid, for example, in a fourth period, if a clock enable signal clk_en and an enable signal en are both on high levels, a control signal ctr is on a high level, and a register samples input data din to output data dout.

Therefore, when clock signal resources are insufficient, a same clock resource may be used in a same region on an FPGA, and a clock is always valid. However, the clock enable signal clk_en and the enable signal en of the register may be controlled. When the two signals are both on high levels, the control signal ctr input to an enable interface of the register is on a high level, and the register can sample the input data din only in this case; otherwise, the register does not perform sampling.

The foregoing solution describes a mode of sampling the input data by inputting the generated control signal to the enable interface of the register (that is, the control signal ctr is used as a gated clock enable signal of the register), allowing the control signal ctr and the enable signal en of the register to both function, and implementing a clock gating function of the register. Alternatively, this may be implemented through logic control in other implementations of the present invention. When the control signal is high and valid, new data of the register is sampled. When the control signal is on a low level, original data of the register is sampled. Therefore, the clock gating function of the register can also be ensured.

Figure 8:
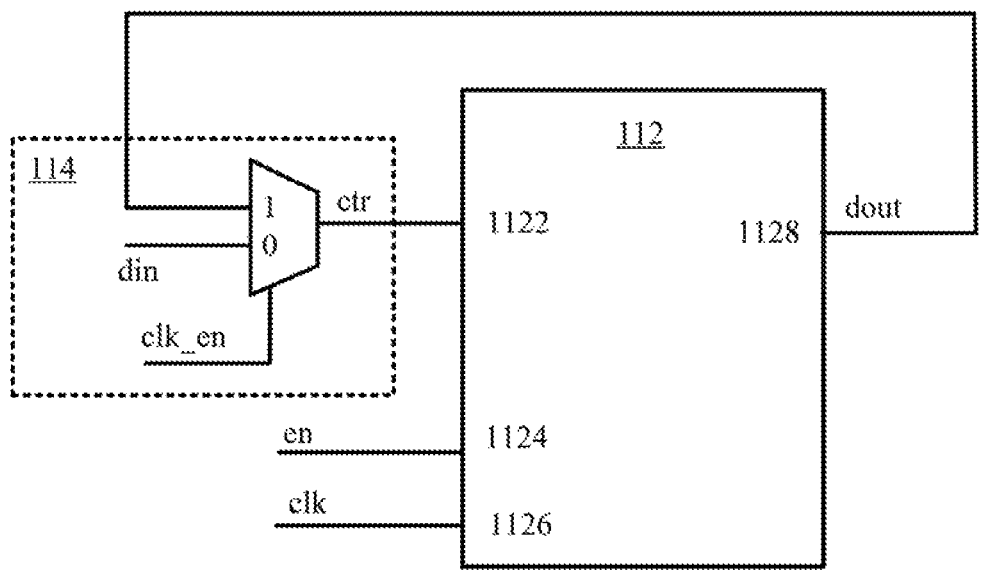
FIG. 8 illustrates a schematic diagram of a debugging unit 110 according to still another embodiment of the present invention.

FIG. 8 illustrates a schematic diagram of a debugging unit 110 according to still another embodiment of the present invention.

As shown in FIG. 8, an output port of a clock control unit 114 is coupled to an input interface 1122 of a register 112. An enable interface 1124 of the register 112 receives an enable signal en of the register. A clock interface 1126 of the register receives a clock signal clk. An output interface of the register is coupled to an input port of the clock control unit 114, and inputs output data to the clock control unit 114 again.

The clock control unit 114 generates a control signal based on input data (that is, input data din and output data dout) and a clock enable signal, where the control signal is used to control the input data of the register 112. In an embodiment, the clock control unit 114 includes a data selector. Further, the data selector is an either-or data selector. As shown in FIG. 8, the data selector has four ports in total, where a first input port receives the input data din of the register, a second input port receives the output data dout of the register 112, one data selection port is connected to a clock enable signal clk_en, and one output port is coupled to the input interface 1122. The data selector outputs the control signal ctr. In this embodiment of the present invention, the clock control unit 114 may select, under control of the clock enable signal clk_en, to output the input data din or output data dout to the input interface 1122 of the register 112.

In the clock control unit 114 shown in FIG. 8, in a validity period of the clock signal clk, if the clock enable signal clk_en is on a high level, an input port corresponding to "1" is selected, that is, the input data din is output to the input interface 1122 of the register. In this case, if the enable signal en of the register is an a high level (that is, indicating that the control signal ctr is on a high level), the input data din is sampled, that is, the register 112 samples new data. Likewise, in the validity period of the clock signal clk, if the clock enable signal clk_en is on a low level (indicating that the control signal ctr is on a low level), an input port corresponding to "0" is selected, that is, the output data dout is output to the input interface 1122 of the register. In this case, if the enable signal en of the register is high, the output data dout is sampled, that is, the register 112 samples original data.

In the implementation of the present invention, in an FPGA test, the foregoing method may be used to implement: when the clock enable signal clk_en and the enable signal en of the register are both valid, sampling the new data; or when the clock enable signal clk_en is disabled but the enable signal en of the register is valid, sampling the original data, to test a clock gating function of the register.

It should be noted that, the design of the data selector shown herein is used only as an example, and this embodiment of the present invention is not limited thereto. Based on the embodiment disclosed herein, other designs that those skilled in the art can think of, and any operation of a data updating function implemented based on the clock enable signal clk_en by adding the clock enable signal clk_en to the input interface 1122 of the register shall fall within the protection scope of the present invention.

Figure 9:
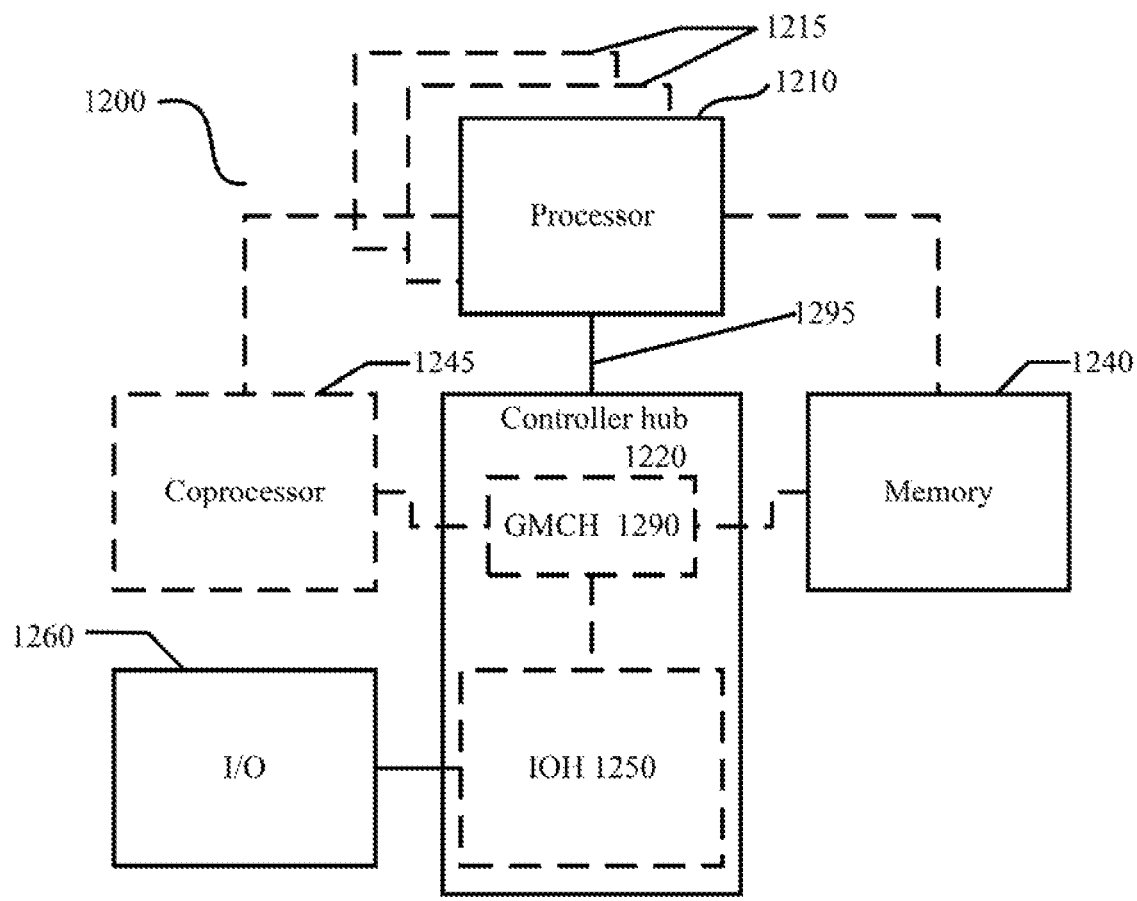
FIG. 9 illustrates a schematic diagram of a computer system 1200 according to an embodiment of the present invention.

FIG. 9 illustrates a schematic diagram of a computer system 1200 according to an embodiment of the present invention. The computer system 1200 shown in FIG. 9 may be applied to laptops desktop computers, hand-held PCs, personal digital assistants, workstations, servers, network devices, network hubs, switches, embedded processors, digital signal processors (DSP), graphics devices, video game devices, set-top boxes, microcontrollers, cellular phones, portable media players, hand-held devices, and various other electronic devices. The present invention is not limited thereto. All processors and/or other systems executing logics that may be included and disclosed in this specification shall fall within the protection scope of the present invention.

As shown in FIG. 9, the system 1200 may include one or more processors 1210 and 1215. The processors are coupled to a controller hub 1220. In an embodiment, the controller hub 1220 includes a graphics memory controller hub (GMCH) 1290 and an input/output hub (IOH) 1250 (which may be on a separate chip). The GMCH 1290 includes a memory controller and a graphics controller that are coupled to a memory 1240 and a coprocessor 1245. The IOH 1250 couples an input/output (I/O) device 1260 to the GMCH 1290. Alternatively, the memory controller and the graphics controller are integrated in a processor. Therefore, the memory 1240 and the coprocessor 1245 are directly coupled to the processor 1210. In this case, the controller hub 1220 includes only the IOH 1250.

The additional processor 1215, which is optional, is indicated by using a dashed line in FIG. 9. Each processor 1210 or 1215 may include one or more of the processor cores described in this specification, and may be one version of the processor 100 shown in FIG. 1.

The memory 1240 may be, for example, a dynamic random access memory (DRAM) or a phase change random access memory (PCM) or a combination thereof. For at least one embodiment, the controller hub 1220 communicates with the processor 1210 or 1215 by using a multi-drop bus (multi-drop bus) such as a front side bus (FSB), a point-to-point interface such as a quick path interconnect (QPI) interface, or a similar connection 1295.

In an embodiment, the coprocessor 1245 is a dedicated processor, such as a high throughput MIC processor, a network or communication processor, a compression engine, a graphics processor, a GPGPU, or an embedded processor. In an embodiment, the controller huh 1220 may include an integrated graphics accelerator.

In an embodiment, the processor 1210 executes an instruction for controlling a general type of data processing operation. A coprocessor instruction may be embedded in the instruction. The processor 1210 identifies, for example, a type of coprocessor instruction that should be executed by the attached coprocessor 1245. Therefore, the processor 1210 issues the coprocessor instruction (or a control signal that indicates the coprocessor instruction) to the coprocessor 1245 over a coprocessor bus or another interconnection. The coprocessor 1245 receives and executes the received coprocessor instruction.

Figure 10:
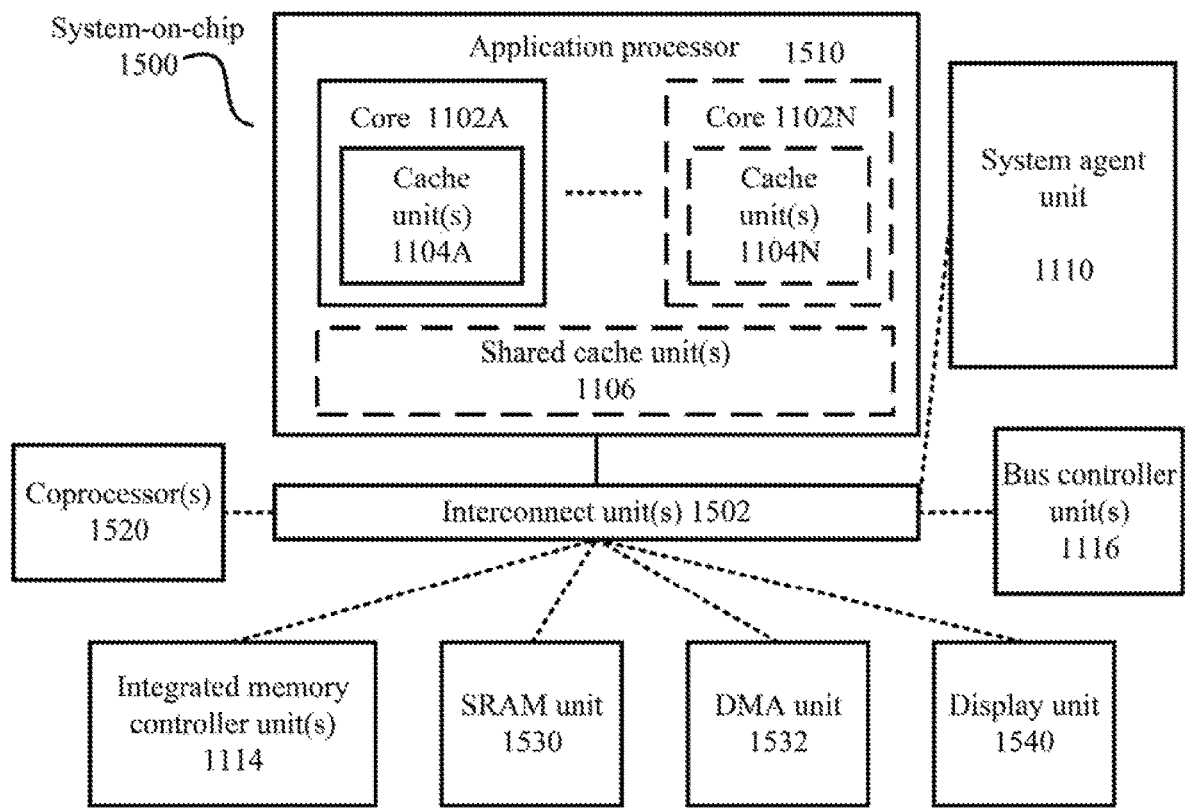
FIG. 10 illustrates a schematic diagram of a system-on-chip (SoC) 1500 according to an embodiment of the present invention.

FIG. 10 illustrates a schematic diagram of a system-on-chip (SoC) 1500 according to an embodiment of the present invention. As shown in FIG. 10, an interconnect unit 1502 is coupled to an application processor 1510 (which may include, for example, the processor 100 shown in FIG. 1 but not shown in FIG. 10), a system agent unit 1110, a bus controller unit 1116, an integrated memory controller unit 1114, one or more coprocessors 1520, a static random access memory (SRAM) unit 1530, a direct memory access (DMA) unit 1532, and a display unit 1540 for being coupled to one or more external displays. The application processor 1510 may further include a set of one or more cores 1102A-N and a shared cache unit 1106. The coprocessor 1520 includes an integrated graphics logic, an image processor, an audio processor, and a video processor. In an embodiment, the coprocessor 1520 includes a dedicated processor, such as a network or communication processor, a compression engine, a GPGPU, a high throughput MIC processor, an embedded processor, or the like.

In addition, the system-on-chip described above may be included in an intelligent device to implement corresponding functions in the intelligent device, including but not limited to executing related control programs, data analysis, computing and processing, network communication, controlling peripherals of the intelligent device, and so on.

Such intelligent devices include dedicated intelligent devices such as mobile terminals and personal digital terminals. The devices include one or more system-on-chips of the present invention to perform data processing or control peripherals of the device.

Such intelligent devices also include dedicated devices designed for specific functions, for example, smart speakers and smart display devices. These devices include the system-on-chip of the present invention to control a speaker or a display device, so as to provide the speaker or the display device with additional functions of communication, perception, data processing, and the like.

Such intelligent devices also include various IoT and AIoT devices. These devices include the system-on-chip of the present invention to perform data processing, for example, AI computing or data communication and transmission, thereby implementing denser and more intelligent device distribution.

Such intelligent devices may also be used in a vehicle, for example, may be implemented as a vehicle-mounted device or may be built into the vehicle, so as to provide a data-processing capability for intelligent driving of the vehicle.

Such intelligent devices may also be used in the home and entertainment field, for example, may be implemented as a smart speaker, a smart air conditioner, a smart refrigerator, a smart display device, or the like. These devices include the system-on-chip of the present invention to perform data processing and peripheral control, making home and entertainment devices intelligent.

In addition, such intelligent devices may also be used in the industrial field, for example, may be implemented as an industrial control device, a sensing device, an IoT device, an AIoT device, a braking device, or the like. These devices include the system-on-chip of the present invention to perform data processing and peripheral control, making industrial equipment intelligent.

The foregoing description of intelligent devices is merely exemplary, and the intelligent device according to the present invention is not limited thereto. All intelligent devices capable of performing data processing by using the system-on-chip of the present invention fall within the protection scope of the present invention.

It should be understood that, for the purpose of streamlining the present disclosure and aiding in the understanding of one or more of the inventive aspects, in the foregoing description of the exemplary embodiments of the present invention, various features of the present invention are sometimes grouped together into a single embodiment, diagram, or description thereof. However, the disclosed method is not to be interpreted as reflecting an intention that the claimed invention requires more features than those expressly recited in each claim. Rather, as the following claims reflect, inventive aspects lie in less than all features of a single embodiment disclosed above. Therefore, the claims following the detailed description are hereby expressly incorporated into this detailed description, with each claim standing on its own as a separate embodiment of the present invention.

Those skilled in the art should understand that the modules, units or components of the devices in the examples disclosed herein may be arranged in the devices described in the embodiments, or alternatively located in one or more devices different from the devices in the examples. The modules described in the foregoing examples may be combined into one module or may be divided into a plurality of submodules.

Those skilled in the art can understand that the modules in the devices in the embodiments may be adaptively changed and provided in one or more devices different from the devices in the embodiments. The modules, units or components in the embodiments may be combined into one module, unit or component, and in addition, they may be divided into a plurality of submodules, subunits or subcomponents. All features disclosed in the description (including the accompanying claims, abstract and drawings), and all processes or units of any methods or devices so disclosed, may be combined in any way, except that at least some of such features and/or processes or units are mutually exclusive. Unless otherwise clearly stated, each feature disclosed in the description (including the accompanying claims, abstract and drawings) may be replaced by alternative features serving the same, equivalent or similar purpose.

In addition, those skilled in the art can understand that, although some of the embodiments described herein include some but not other features included in other embodiments, combinations of features of different embodiments are meant to be within the scope of the present invention and form different embodiments. For example, in the following claims, any one of the claimed embodiments may be used in any combination.

In addition, some of the embodiments are described herein as a combination of methods or method elements that can be implemented by a processor of a computer system or by other devices that execute the functions. Therefore, a processor having necessary instructions for implementing the methods or method elements forms a device for implementing the methods or method elements. In addition, the elements described in the device embodiments are examples of devices for implementing functions executed by elements for the purpose of implementing the present invention.

As used herein, unless otherwise specified, the use of ordinals "first", "second", "third", and the like to describe general objects merely represents different instances involving similar objects, and is not intended to imply that objects so described must have a given order in time, space, sorting or any other aspects.

Although the present invention has been described according to a limited quantity of embodiments, benefiting from the foregoing description, those skilled in the art can understand that other embodiments may be conceived of within the scope of the present invention described thereby. In addition, it should be noted that the language used in this specification is mainly selected for readability and teaching purposes, rather than for interpreting or defining the subject of the present invention. Therefore, many modifications and variations made without departing from the scope and spirit of the appended claims are apparent to persons of ordinary skill in the art. In regard to the scope of the present invention, the disclosure of the present invention is descriptive rather than restrictive, and the scope of the present invention should be defined by the appended claims.

What is claimed is:

1. A debugging unit, comprising:
a register, adapted to sample input data under control of a clock signal, wherein the register includes
an input interface, adapted to receive a control signal;
an enable interface, adapted to receive an enable signal of the register;
a clock interface, adapted to receive the clock signal; and
an output interface, coupled to an input port of a clock control unit, and adapted to output data to the clock control unit; and
the clock control unit, adapted to generate the control signal based on a clock enable signal to control the clock signal, so that the register is controlled to sample the input data in a validity period of the clock signal when the control signal is valid, wherein an output port of the clock control unit is coupled to the input interface of the register, and further adapted to generate the control signal based on the input data and the clock enable signal, wherein the control signal is used to control the input data of the register.

2. The debugging unit according to claim 1, wherein the clock control unit comprises:
a data selector, wherein a first input port of the data selector receives the input data, a second input port of the data selector receives the output data of the register, and the data selector is adapted to select, under control of the clock enable signal, to output the input data or output data to the input interface of the register.

3. The debugging unit according to claim 2, wherein the register is adapted to:
in the validity period of the clock signal, if the clock enable signal and the enable signal of the register are both high, sample the input data of the register; or
in the validity period of the clock signal, if the clock enable signal is low and the enable signal of the register is high, sample the output data of the register.

4. A processor, comprising:
the debugging unit according to claim 1; and
a signal generation unit, adapted to generate a debugging signal for the debugging unit.

5. The processor according to claim 4, wherein
the debugging signal comprises one or more of the following signals: the clock signal, the clock enable signal, and an enable signal of the register.

6. A system-on-chip, comprising:
the processor according to claim 4.

7. An intelligent device, comprising the system-on-chip according to claim 6.

8. A debugging unit, comprising:
a register, adapted to sample input data under control of a clock signal, wherein the register includes;
an input interface, adapted to receive the input data;
an enable interface, adapted to receive the control signal;
a clock interface, adapted to receive the clock signal; and
an output interface, adapted to output data;
wherein the register is adapted to;
in a validity period of the clock signal, if a clock enable signal and the enable signal of the register are both on high levels, sample the input data; or
in the validity period of the clock signal, if the clock enable signal and the enable signal of the register are not both on high levels, skip sampling the input data; and
a clock control unit, adapted to generate the control signal based on the clock enable signal to control the clock signal, so that the register is controlled to sample the input data in the validity period of the clock signal when the control signal is valid, wherein the clock control unit is coupled to an enable interface of the register, and further adapted to generate the control signal based on the clock enable signal and an enable signal of the register, and wherein the clock control unit includes an AND gate, wherein a first input port of the AND gate is adapted to receive the clock enable signal, a second input port of the AND gate is adapted to receive the enable signal of the register, and an output port of the AND gate is coupled to the enable interface of the register.

9. A processor, comprising:
the debugging unit according to claim 8; and
a signal generation unit, adapted to generate a debugging signal for the debugging unit.

10. The processor according to claim 9, wherein
the debugging signal comprises one or more of the following signals: the clock signal, the clock enable signal, and an enable signal of the register.

11. A system-on-chip, comprising:
the processor according to claim 9.

12. An intelligent device, comprising the system-on-chip according to claim 11.

13. A debugging unit, comprising:
a register, adapted to sample input data under control of a clock signal, wherein the register includes;

an input interface, adapted to receive the input data;
an enable interface, adapted to receive the control signal;
a clock interface, adapted to receive the clock signal; and
an output interface, adapted to output data;
wherein the register is adapted to;
in a validity period of the clock signal, if a clock enable signal and the enable signal of the register are both on high levels, sample the input data; or
in the validity period of the clock signal, if the clock enable signal and the enable signal of the register are not both on high levels, skip sampling the input data; and
a clock control unit, adapted to generate a control signal based on the clock enable signal to control the clock signal, so that the register is controlled to sample the input data in the validity period of the clock signal when the control signal is valid, wherein the clock control unit is coupled to an enable interface of the register, and further adapted to generate the control signal based on the clock enable signal and an enable signal of the register, and wherein the clock control unit includes a data selector, adapted to select, under control of the clock enable signal, whether to output the enable signal of the register to the enable interface of the register.

14. A processor, comprising:
the debugging unit according to claim 13; and
a signal generation unit, adapted to generate a debugging signal for the debugging unit.

15. The processor according to claim 14, wherein
the debugging signal comprises one or more of the following signals: the clock signal, the clock enable signal, and an enable signal of the register.

16. A system-on-chip, comprising:
the processor according to claim 14.

17. An intelligent device, comprising the system-on-chip according to claim 16.

18. A debugging unit, comprising:
a register, adapted to sample input data under control of a clock signal, wherein the register includes;
an input interface, adapted to receive the input data;
the enable interface, adapted to receive the control signal;
a clock interface, adapted to receive the clock signal; and
an output interface, adapted to output data;
wherein the register is adapted to;
in a validity period of the clock signal, if a clock enable signal and the enable signal of the register are both on high levels, sample the input data; or
in the validity period of the clock signal, if the clock enable signal and the enable signal of the register are not both on high levels, skip sampling the input data; and
a clock control unit, adapted to generate the control signal based on the clock enable signal to control the clock signal, so that the register is controlled to sample the input data in the validity period of the clock signal when the control signal is valid, wherein the clock control unit is coupled to an enable interface of the register, and further adapted to generate a control signal based on the clock enable signal and an enable signal of the register, and wherein the clock control unit includes a data selector, adapted to select, under control of the enable signal of the register, whether to output the clock enable signal to the enable interface of the register.

19. A processor, comprising:
the debugging unit according to claim 18; and
a signal generation unit, adapted to generate a debugging signal for the debugging unit.

20. The processor according to claim 19, wherein
the debugging signal comprises one or more of the following signals: the clock signal, the clock enable signal, and an enable signal of the register.

21. A system-on-chip, comprising:
the processor according to claim 19.

22. An intelligent device, comprising the system-on-chip according to claim 21.

* * * * *